US012771081B2

(12) United States Patent
Dillon et al.

(10) Patent No.: US 12,771,081 B2
(45) Date of Patent: Oct. 20, 2026

(54) ELECTRICAL CONNECTOR VERIFICATION SYSTEM

(71) Applicant: GM GLOBAL TECHNOLOGY OPERATIONS LLC, Detroit, MI (US)

(72) Inventors: Christopher Dillon, Clarkston, MI (US); Wuhua Yang, Superior Township, MI (US); Jeffrey D Kucera, Rochester Hills, MI (US); Dalong Gao, Rochester, MI (US); Xiang Zhao, Novi, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 905 days.

(21) Appl. No.: 18/145,636

(22) Filed: Dec. 22, 2022

(65) Prior Publication Data

US 2024/0213722 A1 Jun. 27, 2024

(51) Int. Cl.

| | |
|---|---|
| ***H01R 13/66*** | (2006.01) |
| ***G06F 3/16*** | (2006.01) |
| ***H01R 13/631*** | (2006.01) |
| ***H05K 13/00*** | (2006.01) |

(52) U.S. Cl.

CPC ........... *H01R 13/6691* (2013.01); *G06F 3/16* (2013.01); *H01R 13/631* (2013.01); *H01R 13/6683* (2013.01); *H05K 13/00* (2013.01)

(58) Field of Classification Search

CPC .............. H01R 13/6691; H01R 13/631; H01R 13/6683; H01R 2201/20; H01R 43/26; H01R 13/641; G06F 3/16; H05K 13/00; G01R 31/66; G01M 13/00

See application file for complete search history.

(56) References Cited

U.S. PATENT DOCUMENTS

| | | | | |
|---|---|---|---|---|
| 3,760,484 A * | 9/1973 | Kowalski | H05K 13/0053 | 221/12 |
| 6,532,482 B1 * | 3/2003 | Toyosato | G06F 3/16 | 708/131 |
| 2010/0242599 A1 * | 9/2010 | Ogawa | H01R 43/26 | 73/488 |
| 2015/0139446 A1 * | 5/2015 | Tawada | G10L 21/0208 | 381/94.2 |
| 2016/0163176 A1 * | 6/2016 | Benner | H01R 13/641 | 340/687 |
| 2017/0102423 A1 * | 4/2017 | Maalouf | H01R 13/502 | |

* cited by examiner

*Primary Examiner* — Matthew A Eason

(74) *Attorney, Agent, or Firm* — Ingrassia Fisher & Lorenz, LLP | IFL

(57) ABSTRACT

An electrical connector verification system including a microphone for detecting a first sound generated by an engagement of a locking mechanism of an electrical connector and for generating a first signal representative of the first sound, a processor for generating a control signal in response to the first signal matching a second signal representative of a second sound generated in response to a correct engagement of the locking mechanism of the electrical connector above a certainty threshold, and a user interface for displaying an indication of a correctly seated electrical connector in response to the control signal.

20 Claims, 4 Drawing Sheets

ELECTRICAL CONNECTOR VERIFICATION SYSTEM

INTRODUCTION

The present disclosure generally relates to electronic component assembly techniques, and more particularly relates to a method and an apparatus for identifying a correctly seated electrical connector during assembly of a complex electromechanical system, such as an automobile.

Automotive assembly involves a complex assembly process involving a multitude of complex electrical and mechanical systems which all must be performing properly and in unison for the vehicle to operate in the most efficient manner. Electrical components are often connected to a wiring harness or communications bus, such as a Controller Area Network (CAN) bus using specialized electrical connectors. These connectors, commonly referred to as a connector position assurance (CPA) electrical connector, include a positive locking mechanism which closes after when the connector is seated and ensure that the connector does not become disengaged during operation of the vehicle. A CPA connector is configured for ensuring the contact position of a plug housing on a mating plug housing such that the housing is configured to be pushed onto the plug housing in a mounting direction and includes a locking element configured to block a latching element of the plug housing.

Occasionally during assembly, a connector may not be completely seated and the locking connector not completely engaged. In a factory environment with elevated levels of noise and vibration, an assembler may not be able to reliably detect the haptic and acoustic feedback resulting from the proper engagement of the electrical connector. During visual inspection and initial vehicle functional testing the vehicle may perform as expected, however, after some duration of operational use by the customer, the connector may become disconnected causing a user warning or malfunction of a vehicle system. The vehicle is then returned for a repair under warranty causing inconvenience for the vehicle owner and warranty costs for the manufacturer. Accordingly, it is desirable to address the aforementioned problems and to provide systems and methods verifying an electrical connector is fully installed and locked and the CPA closed ensuring the connector remains mated. Furthermore, other desirable features and characteristics of the present disclosure will become apparent from the subsequent detailed description and the appended claims, taken in conjunction with the accompanying drawings and the foregoing technical field and background.

SUMMARY

Vehicle fault diagnosis systems for verifying a correct installation of an electrical connector including a latching mechanism are provided. In one embodiment the system includes an apparatus including a sensor configured to detect a first vibration generated by an engagement of a locking mechanism of an electrical connector and to generate a first signal representative of the first vibration, a memory for storing a second signal representative of a second vibration generated in response to a properly engaged locking mechanism of the electrical connector, a processor configured to compare the first signal to the second signal and to generate a connector status signal in response to the first signal matching the second signal above a threshold certainty, and a user interface for displaying an indication of a fully seated connector in response to the connector status signal.

In accordance with another exemplary embodiment, a haptic feedback device for providing a haptic feedback to a user in response to the connector status signal.

In accordance with another exemplary embodiment, the user interface is further operative to generate an audio alert in response to the connector status signal.

In accordance with another exemplary embodiment, the user interface is further operative to generate an audible output of the second vibration in response to the connector status signal.

In accordance with another exemplary embodiment, the first vibration is a first sound and the second vibration is a second sound.

In accordance with another exemplary embodiment, the first signal is a first time domain signal and wherein the processor is further configured to generate a first frequency domain signal in response to the first signal and the second signal is a second frequency domain signal.

In accordance with another exemplary embodiment, the first signal is a first time domain signal and wherein the processor is further configured to generate a first frequency domain signal in response to the first signal and the second signal includes a second time domain signal and a second frequency domain signal and wherein the connector status signal is generated in response to a first comparison of the first time domain signal and the second time domain signal and a second comparison of the first frequency domain signal and the second frequency domain signal.

In accordance with another exemplary embodiment, the user interface is an assembly station status board.

In accordance with another exemplary embodiment, the user interface is a wrist mounted display.

In accordance with another exemplary embodiment, a method including detecting, by a sensor, a first vibration generated by an engagement of a locking mechanism of an electrical connector, generating, by the sensor, a first signal representative of the first vibration, generating, by a processor, a control signal in response to the first signal matching a second signal representative of a second vibration generated in response to an engagement of a fully seated electrical connector above a threshold certainty, displaying, by a user interface, an indication of a fully seated connector in response to the control signal.

In accordance with another exemplary embodiment, providing a haptic feedback indicative of the engagement of the fully seated electrical connector to a user in response to the control signal.

In accordance with another exemplary embodiment, generating an audio alert indicative of the fully seated connector in response to the control signal.

In accordance with another exemplary embodiment, the user interface is further operative to generate an audible output of the second signal in response to the control signal In accordance with another exemplary embodiment, the electrical connector is a connector position assurance connector for an automotive application.

In accordance with another exemplary embodiment, the first vibration is a first sound and the second signal is representative of a second sound.

In accordance with another exemplary embodiment, the first vibration is a first time domain signal and wherein the processor is further configured to generate a first frequency domain signal in response to the first vibration and the second signal is a second frequency domain signal.

In accordance with another exemplary embodiment, the first vibration is generated by a connector locking mechanism on the electrical connector engaging a restraint on a connector socket.

In accordance with another exemplary embodiment, a microphone for detecting a sound generated by the engagement of the locking mechanism of the electrical connector.

In accordance with another exemplary embodiment, an electrical connector verification system including a microphone for detecting a first sound generated by an engagement of a locking mechanism of an electrical connector and for generating a first signal representative of the first sound, a processor for generating a control signal in response to the first signal matching a second signal representative of a second sound generated in response to a correct engagement of the locking mechanism of the electrical connector above a certainty threshold, and a user interface for displaying an indication of a correctly seated electrical connector in response to the control signal.

In accordance with another exemplary embodiment, an accelerometer for detecting a first vibration generated by the engagement of the locking mechanism of the electrical connector and for generating a third signal representative of the first vibration and wherein the processor is further operative for generating the control signal in response to the third signal matching a fourth signal representative of a second vibration generated in response to the correct engagement of the locking mechanism of the electrical connector above the certainty threshold.

BRIEF DESCRIPTION OF THE DRAWINGS

The exemplary embodiments will hereinafter be described in conjunction with the following drawing figures, wherein like numerals denote like elements, and wherein.

DETAILED DESCRIPTION

The following detailed description is merely exemplary in nature and is not intended to limit the application and uses. Furthermore, there is no intention to be bound by any expressed or implied theory presented in the preceding technical field, background, summary or the following detailed description. As used herein, the term module refers to any hardware, software, firmware, electronic control component, processing logic, and/or processor device, individually or in any combination, including without limitation: application specific integrated circuit (ASIC), an electronic circuit, a processor (shared, dedicated, or group) and memory that executes one or more software or firmware programs, a combinational logic circuit, and/or other suitable components that provide the described functionality.

Figure 1:
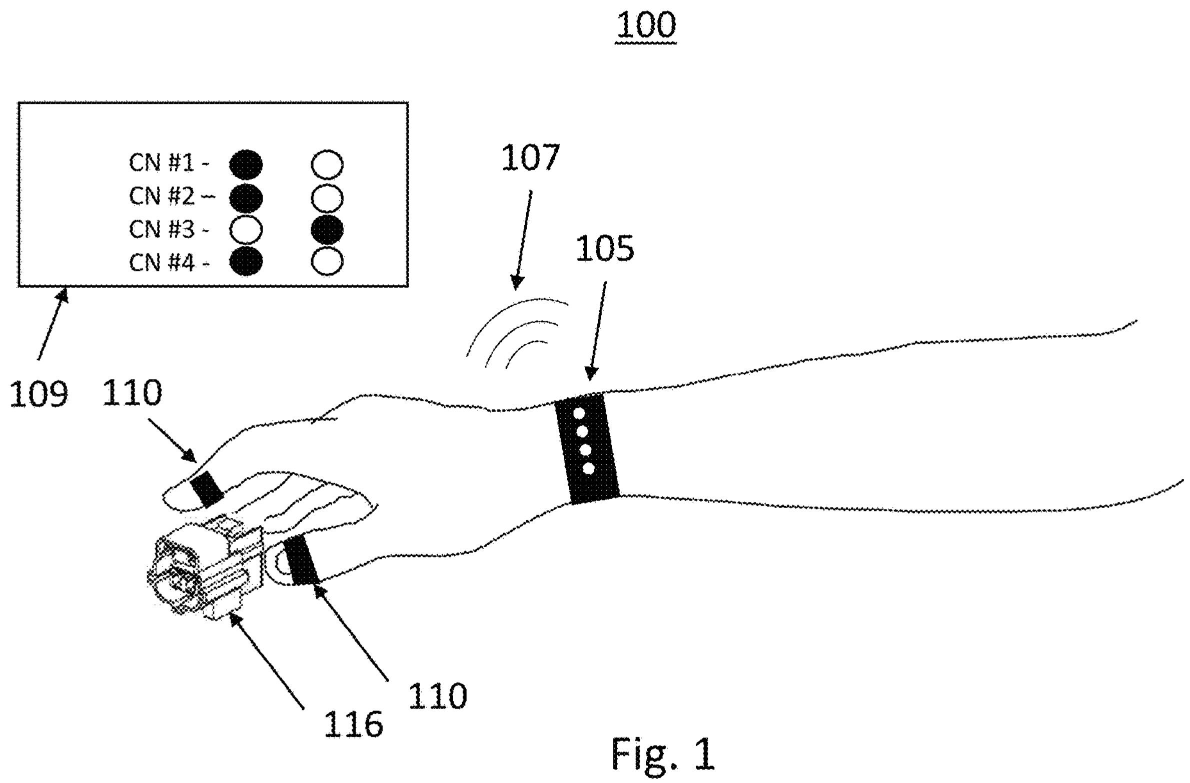
FIG. 1 shows an exemplary environment for an electrical connector assembly verification system in accordance with various embodiments.

Turning now to FIG. 1, an exemplary environment 100 for an electrical connector assembly verification system is shown in accordance with various embodiments. The exemplary environment 100 includes a wrist mounted monitor 105, a plurality of sensors 110, a connector assembly status board 109 and an electrical connector 116.

The exemplary environment 100 is illustrative of an assembly line station-level electrical connector assembly verification system to provide verification that the connector 116 is properly mated and will remain mated after vehicle assembly. This positive electrical connection detection system provides an enhanced assurance of correctly seated electrical connectors to increase vehicle reliability and to reduce required vehicle servicing due to detached electrical connectors. During the vehicle assembly process, an assembler wears the monitor 105 and the plurality of sensors 110. The monitor 105 and the plurality of sensors 110 may be integrated into a glove or other garment, or can be worn separately and are configured to detect the acoustic and/or vibrational signature of the correct engagement of an electrical connector during the assembly process.

The plurality of sensors 110 can include one or more sensors configured to detect a sound or vibration caused by engagement of a connector lock as the connector 116 is correctly seated into a corresponding socket or electrical component. The plurality of sensors 110 may include microphones, haptic sensors or a combination thereof. Data generated by the plurality of sensors 110 may be coupled to the monitor 105 via a wires or wirelessly via a near field communications protocol, blue-tooth connection or the like.

In some exemplary embodiments, the wrist mounted monitor 105 may include a visual user interface, such as a plurality of light emitting diodes (LEDs) or a user interface screen which can provide feedback to a user on the connector assembly status during the vehicle assembly process. The monitor 105 can be configured with a signal processor to perform a signal processing algorithm on signals received from the plurality of sensors 110 to have an effective noise filtering software that can distinguish the "click" sound pattern of the correctly engaged connector from various noises in assembly working environment. The monitor 105 can further be configured to communicate the connector status with the connector assembly status board 109 wirelessly, via a wireless network radio frequency signal 107 of the like in order to display the various connector statuses. In some exemplary embodiments, the wrist mounted monitor 105 may physically include the plurality of sensors 110 or may include an additional plurality of sensors such as a sound detecting sensor, vibration detecting sensor, microphone and amplifier, haptic sensors or a combination thereof.

The connector assembly status board 109 forms part of a vehicle assembly line station-level system to display the verification of electrical connectors being fully assembled via wrist-mounted monitor 105 and plurality of sensors 110. Communication between the monitor 105 and the assembly line station can be configured to prevent progression of the vehicle to a next assembly line station until the connector mating is verified. In some exemplary embodiments, when a vehicle initially reaches the assembly line station, each of the connector status' will be displayed on the connector assembly status board 109 as not connected. This not connected status may be indicated by a red light, one of two lights labelled as not connected, or the like. When the assembler correctly engages a connector and the monitor detects the identifying click for a particular connector, the monitor 105 will transmit a data signal to the connector assembly status board 109 or the communicatively coupled assembly line station such that the connector status is updated to connected, indicated by a green light, another of the two lights labeled connected, or the like.

Figure 2:
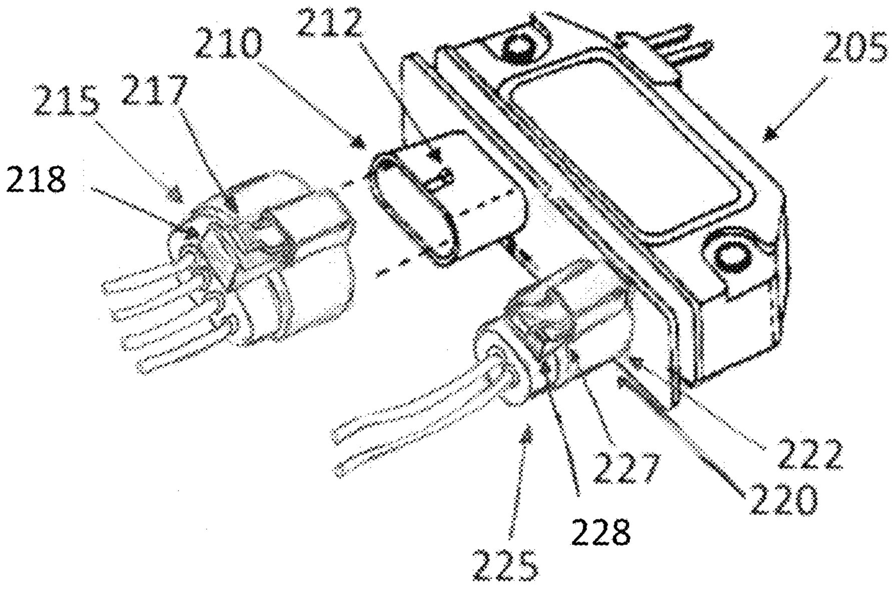
FIG. 2 shows an exemplary automotive application for use of CPA electrical connectors in accordance with various embodiments.

Turning now to FIG. 2, an exemplary automotive application for use of electrical connectors is shown in accordance with various embodiments. The exemplary application is illustrative of an automotive electronic component 205 a first electrical connector 215 with a corresponding first electrical connector socket 210 and a second electrical connector 225 with a corresponding second electrical connector socket 220.

The automotive electronic component 205 may be any number of automotive or nonautomotive components requiring conductive couplings for receiving or supplying electrical power and/or transmitting and/or receiving data. For example, the electronic component 205 may be an automotive electronic control unit (ECU) requiring electrical connections for receiving electrical power and for transmitting and receiving data. The ECU can transmit and receive data via a CAN bus or the like and may receive data from one or more vehicle sensors or other ECUs. In addition, the ECU can receive electrical power via one or more of the conductors of the first electrical connector 215 or the second electrical connector 225.

The electronic component 205 includes a first socket 210 corresponding to the first electrical connector 215 which is staged to be mated to the electrical socket 210, and a second socket 220 (hidden) corresponding to the second electrical connector 225 which is in the mated position on the second socket 220. The first electrical connector 215 and the second electrical connector 225 are shown as a type of connector having a first latching element 217 and a second latching element 227 respectively. The first electrical connector 215 has a connector position assurance component (CPA) 218 in an open position and the second electrical connector 225 has a connector position assurance component (CPA) 228 in the closed position. When the first electrical connector 215 is inserted into the first socket 210 and is fully seated, the first latching element 217 will engage with a first detent 212. The first detent 212 is an extrusion from the outer surface of the first socket 210 configured to deflect the first latching element 217 away from the first socket 210 during insertion of the first electrical connector 215 into the first socket 210. When the first electrical connector 215 is fully seated, the first detent 212 is pushed into a locked position in the first latching element 217 preventing the first electrical connector 215 from being extracted from the first socket 210. The first electrical connector 215 can be extracted from the first socket by deflecting the first latching element 217 away from the outer surface of the first socket 210 such that the first latching element 217 clears the first detent 212. As shown with the second electrical connector 225 with the second CPA 228 in the closed position, the second latching element 227 cannot be deflected because the second CPA 228 stops the motion of travel of the second flexible latching element 227. Thus the second CPA 228 ensures the second electrical connector 225 remains properly mated to the electrical component 205 and stays retained to the second electrical socket 220 by retaining to the second detent 222.

Figure 3:
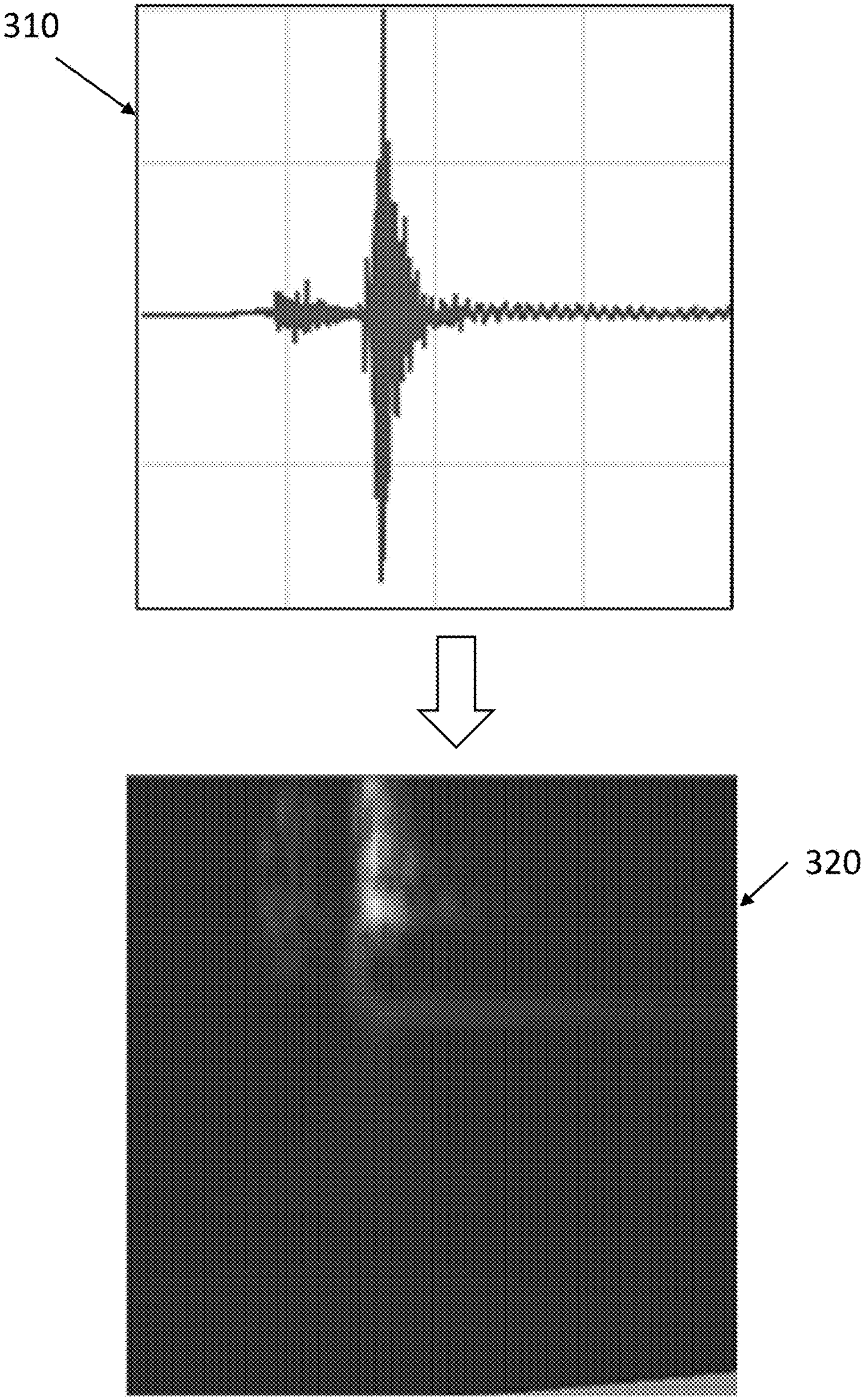
FIG. 3 shows a graphical illustration of the generation of a spectral diagram in accordance with various embodiments.

Turning now to FIG. 3, a graphical illustration of the generation of a spectral diagram is shown in accordance with various embodiments. The sound time domain response 310 is generated in response to a sound or vibration caused by engagement of a connector lock as the connector is correctly seated into a corresponding socket or electrical component. The Scalogram 320 by continuous wavelet transform can be generated in response to a combination of the frequency domain response and the time domain response 310.

The Scalogram 320 is representative of a matrix of values representative of a magnitude of the detected sound at a particular frequency and a particular time. A signal processor integral to the monitor can be used to compare these generated matrix values to one or more of a plurality of stored matrix values representative of a correctly engaged connector. In response to the generated matrix and the known matrix having a correlation above a threshold probability, the monitor may then generate one or more control signals to update the connector status to "connected" on the monitor mounted user interface and/or the connector assembly status board.

In some exemplary embodiments, the scalogram generated in response to the detected sound can be compared to a group of recorded samples of correctly engaged connector locks stored in a memory to determine if the currently detected sound was generated from a correctly engaged connector lock or an improperly or incompletely engaged connector lock. The scalogram 320 by continuous wavelet transform can provide a time-frequency representation of the detected sound. The generated scalogram 320 may be compared against a scalogram of the sound of a known correctly engaged connector lock as the connector is correctly seated into a corresponding socket. Comparison of the time-frequency representation can provide an improved correlation between the measured and known connector lock engagement sounds and/or vibrations.

Figure 4:
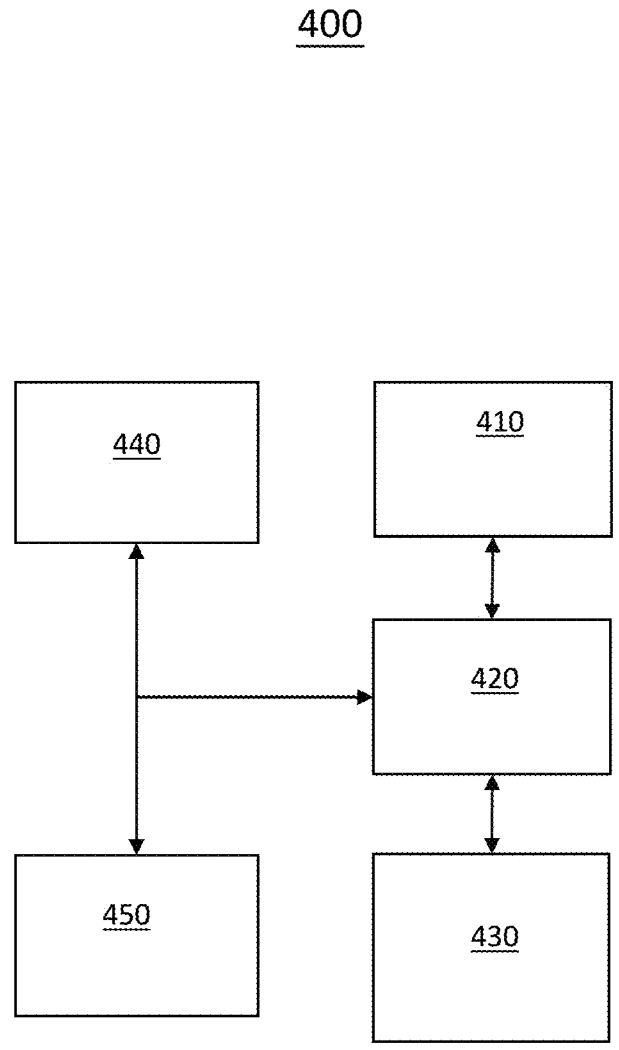
FIG. 4 shows an exemplary system for providing an electrical connector verification in accordance with various embodiments.

Turning now to FIG. 4, an exemplary system 400 for providing an electrical connector verification according to an exemplary embodiment of the present disclosure is shown. In some exemplary embodiments, the method is first initiated in response to a CAN vehicle health assessment scheduler.

The first sensor 440 and the second sensor 450 can be microphones for detecting a sound wave and generating an electrical signal representative of the detected sound wave. Alternatively, one or more of the first sensor 440 and the second sensor 450 may be a vibration sensor for detecting a vibration and generating an electrical signal representative of the detected vibration. In some exemplary embodiments, the vibrational sensor may be an accelerometer. The accelerometer can be configured to detect vibrations resulting from the engagement, or click, of a locking mechanism engaging in a locking connector and socket assembly. The first sensor 440 and the second sensor 450 are communicatively coupled to the processor 420 for coupling the generated electrical signals to the processor 420 for further processing.

The processor 420 is configured to receive one or more electrical signals from the first sensor 440 and the second sensor 450 wherein the electrical signals are time domain signals representative of sounds and/or vibrations detected by the sensors. The processor 420 is then configured to process the electrical signals to determine if the signals are representative of a sound or vibration indicative of a correctly seated CPA connector. The processor 420 may perform a cross correlation function, or other comparative mathematical operation, between the received electrical signal and a stored data representative of a sound or vibration resulting from correctly seating the CPA connector.

In some exemplary embodiments, the processor 420 may generate a frequency domain signal in response to the received time domain signals. This frequency domain signal may likewise be compared to a stored frequency domain signal representative of a known correctly seated CPA connector. The processor 420 can be configured to generate a control indicative of a correctly seated connector in response to the received signal correlating to the stored signal with a certainty exceeding a threshold value. In exemplary embodiments where the first sensor 440 is a microphone and the second sensor is a vibration detector, the processor 420 may receive a first signal representative of a sound and a second signal representative of a vibration. The processor 420 may compare each of these signals individually to stored signal representative of known correct seating of a CPA connector. Each of the comparisons may generate a certain level associated with a current connection of the CPA connector. These two certainties may be used to predict a correctly seated CPA connector if the combined certainty exceeds a threshold value. The control signal indicative of a correctly seated CPA connector may then be generated in response to the combined certainty exceeding the threshold value.

In some exemplary embodiments, a spectral matrix may be generated in response to a time domain response and a frequency domain response of the signals received from one or more of the sensors 440, 450. The spectral matrix can include a magnitude value for each of a plurality of time and frequency pairs. Graphically, the spectral matrix can be represented as a spectral diagram, such as a Scalogram or the like. This spectral matrix generated in response to the received signals representative of sound and/or vibration may then be compared to spectral matrices of sound and/or vibration of generated from known correctly seated CPA connectors.

In response to a determination by the processor 420 of a correctly seated CPA connector, the processor 420 may generate a control signal indicative of the correctly seated CPA connector to couple to the user interface 430 and/or the transmitter 410. The user interface 430 can be configured to generate an indication of the correctly seated CPA connector for presentation to an assembler. The indication may be a visual indication, such as illumination of an LED, indication on a display, generation of an audible alert and/or a haptic feedback such as a vibration generated to be felt by the assembler.

The transmitter 410 can be configured to receive the control signal indicative of the correctly seated CPA connector, to process for transmission and to transmit data indicative of the control signal via a local area network, such as a wireless network. The data can be transmitted to an assembly line station or a connector assembly status board. The assembly line station can be operative to prevent the transition of a vehicle to a subsequent assembly line station in response to not receiving an indication of a correctly seated connector for each of the electrical connections to be made at that assembly line station. The connector assembly status board can receive the data and display an indication of the correctly seated connector or the absence of data indicative of the correctly seated connector. In some exemplary embodiments, the data can be transmitted to a workflow server within the assembly facility for generating a list of connectors to be checked for correct seating at a later assembly line station.

Figure 5:
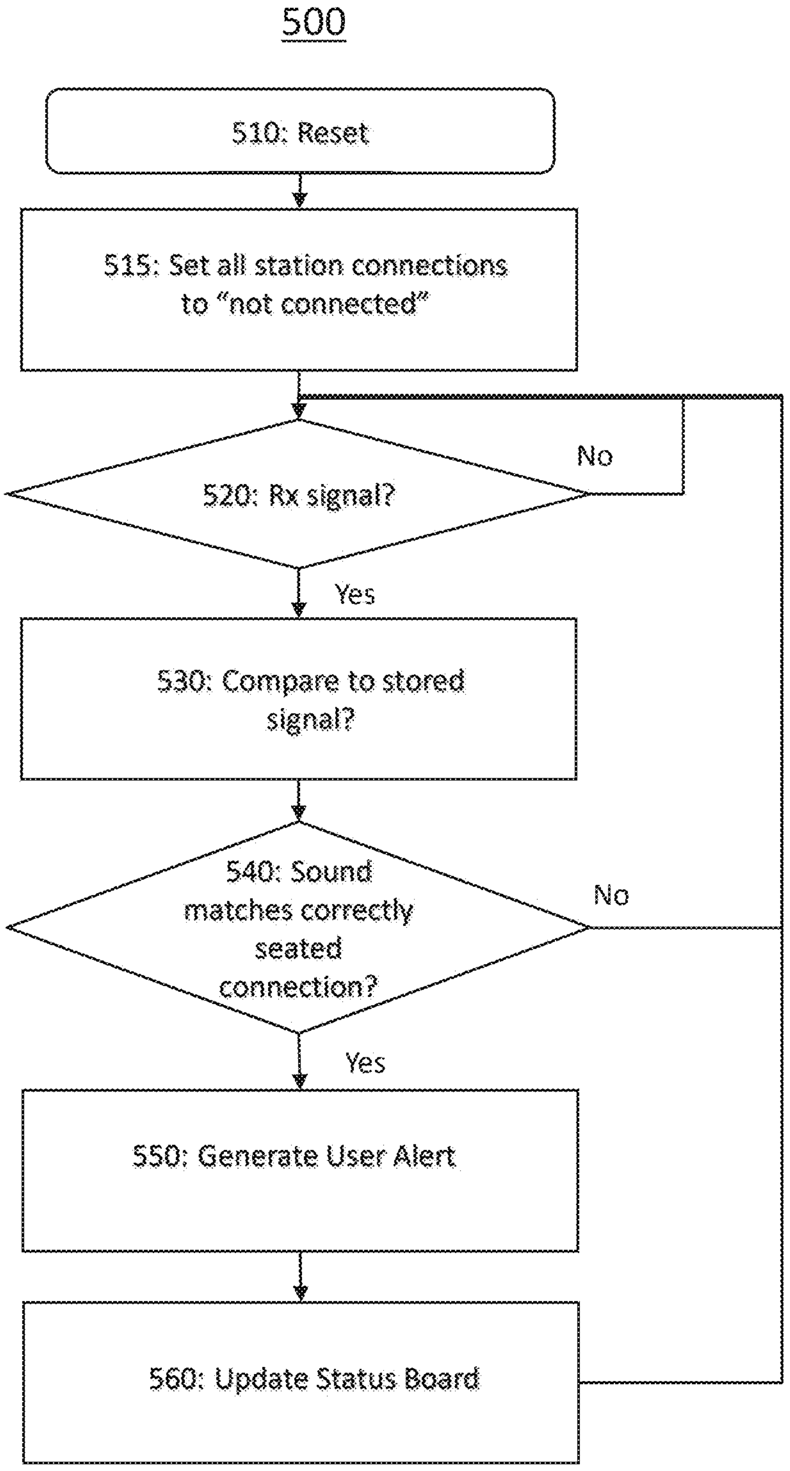
FIG. 5 shows a flow chart illustrating an exemplary method for providing an electrical connector verification system according to an exemplary embodiment of the present disclosure.

Turning now to FIG. 5, a flow chart illustrating an exemplary implementation of a method 500 for providing an electrical connector verification system according to an exemplary embodiment of the present disclosure is shown. In some exemplary embodiments, the algorithm for performing the method 500 is first reset 510 in response to a vehicle initially arriving at an assembly line station.

In response to the reset of the algorithm, the method is operative to set 515 all station connections to 'not connected.'' As the station connections are indicated as 'not connected' a user interface on an assembler worn monitor device can be controlled to indicate that all the connectors for the assembly line station are not connected. Likewise, an assembly station connector status board is reset to indicate that all of the connectors for the assembly line station are not connected.

The method 500 is next operative to determine 520 if a signal that may be indicative of a CPA connector engagement has been detected 520. The signal may be indicative of a sound, a vibration, or both, and is provided by a sensor. In some exemplary embodiments, the sensor can be worn by the assembler as part of a monitor system. Alternatively, the sensor can be positioned proximate to a location of an expected electrical connector such that the sound of the CPA connector engaging can be detected by the sensor. The system can be configured to prefilter the received signal to remove sounds or vibrations which are not within the frequency range of a typical CPA connector engagement. For example, band pass filtering may be performed on the received signal to attenuate signals outside of the expected band before signal processing is performed on the signal to determine if the signal is indicative of a CPA connector engagement. Likewise, the received signal may be digitized and digital filtering may be performed before signal analysis.

The method 500 may next compare 530 the received signal to known examples of correct CPA connector engagement. These examples may be stored in a memory communicatively coupled to the signal processor. The signal processor may perform a cross correlation algorithm to compare the received signal to the stored correct CPA connector engagement to determine if the received signal is indicative of a correctly engaged CPA connector engagement. If the correlation value exceeds a threshold probability value, the received signal is determined to be a correctly seated connection.

If the received sound is not indicative of a correctly seated connection 540, the method 500 can be operative to return to receive 520 a following received signal. If the received signal is determined to be indicative of a correctly seated connection 540, the method 500 is next operative to generate 550 a user alert indicative of the correctly engaged connector. This user alert may be an audio alert, such as playing an amplified sound of the stored correct CPA connector engagement, audio tone or chime. The user alert may further include a haptic feedback, such as a vibration of the wrist mounted monitor, or may include the illumination of an LED or display on a user display indicating a correct CPA connector engagement.

The method 500 can transmit an update 560 to the assembly station status board or an assembly station controller or the like. The update can include data indicative of a the correctly seated status of the connector, may be indicative of the type of connector and/or may be indicative of the assembly station of the assembler. The assembly station may be indicated in the transmitted update if more than one connector engagement monitor is being employed in the assembly facility. The method 500 is then operative to return to receiving the next signal 520.

In some exemplary embodiments, the assembly station can monitor the connector engagement status in order to determine if all of the connectors have been correctly installed. If all the connectors have not been correctly seated, the assembly state may prevent the vehicle from being advanced to the next assembly station. Alternatively, data indicative of the connectors that not been confirmed to be installed correctly may be forwarded to a subsequent assembly station, such as a quality assurance station, where the connection can be verified and/or installation rectified. The method is then operative to return to receiving the next signal 520.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. An apparatus comprising:

a sensor configured to detect a first vibration generated by an engagement of a locking mechanism of an electrical connector and to generate a first time domain signal representative of the first vibration;

a memory for storing a second matrix representative of a second plurality of magnitudes of a second vibration generated in response to a properly engaged locking mechanism of the electrical connector, wherein each of the second plurality of magnitudes correspond to one of a specific time and a specific frequency;

a processor configured to:

perform a continuous wavelet transform on the first time domain signal;

generate a first matrix having a first plurality of magnitudes, each corresponding to the one of the specific time and the specific frequency, in response to the continuous wavelet transform performed on the first time domain signal;

execute a cross correlation function to compare the first plurality of magnitudes of the first matrix to the second plurality of magnitudes of the second matrix for each specific time and each specific frequency; and generate a connector status signal in response to the first plurality of magnitudes of the first matrix and the second plurality of magnitudes of the second matrix having a correlation above a threshold certainty wherein the first matrix is a represented as a first Scalogram and the second matrix is represented as a second Scalogram and wherein the processor is further configured to perform a point-by-point comparison of magnitudes between the first Scalogram and the second Scalogram across a two-dimensional time/frequency coordinate grid to determine if the connector is correctly seated into a corresponding socket and wherein the first Scalogram is generated via the continuous wavelet transform function of both the one of the specific time and the specific frequency; and a user interface for displaying an indication of a fully seated connector in response to the connector status signal.

2. The apparatus of claim 1 further including a haptic feedback device for providing a haptic feedback to a user in response to the connector status signal.

3. The apparatus of claim 1 wherein the user interface is further operative to generate an audio alert in response to the connector status signal.

4. The apparatus of claim 1 wherein the user interface is further operative to generate an audible output of the second vibration in response to the connector status signal.

5. The apparatus of claim 1 wherein the first vibration is a first sound and the second vibration is a second sound.

6. The apparatus of claim 1 wherein the processor is further configured to generate a first frequency domain signal in response to the first signal.

7. The apparatus of claim 1 wherein the first Scalogram is a matrix of values representative of a magnitude of a detected sound at the specific frequency and the specific time.

8. The apparatus of claim 1 wherein the user interface is an assembly station status board.

9. The apparatus of claim 1 wherein the user interface is a wrist mounted display.

10. A method comprising:

detecting, by a sensor, a first vibration generated by an engagement of a locking mechanism of an electrical connector;

generating, by the sensor, a first time domain signal representative of the first vibration;

performing, by a processor, a continuous wavelet transform on the first time domain signal;

generating, by the processor, a first matrix having a first plurality of magnitudes, each corresponding to the one of the specific time and the specific frequency, in response to a continuous wavelet transform performed on the first time domain signal;

comparing, by the processor, the first plurality of magnitudes of the first matrix to a second plurality of magnitudes of a second matrix stored on a memory at a plurality of specific frequencies and a plurality of specific times common to each of the first matrix and the second matrix wherein the first matrix is a represented as a first Scalogram and the second matrix is represented as a second Scalogram and wherein the processor is further configured to perform a point-by-point comparison of magnitudes between the first Scalogram and the second Scalogram across a two-dimensional time/frequency coordinate grid to determine if the electrical connector is correctly seated into a corresponding socket and wherein the first Scalogram is generated via the continuous wavelet transform function of both the one of the specific time and the specific frequency;

generating, by the processor, a control signal in response to the first plurality of magnitudes of the first matrix and the second plurality of magnitudes of the second matrix having a above a threshold certainty;

displaying, by a user interface, an indication of a fully seated connector in response to the control signal.

11. The method of claim 10 including providing a haptic feedback indicative of the engagement of the fully seated electrical connector to a user in response to the control signal.

12. The method of claim 10 including generate an audio alert indicative of the fully seated connector in response to the control signal.

13. The method of claim 10 wherein the user interface is further operative to generate an audible output of the second signal in response to the control signal.

14. The method of claim 10 wherein the electrical connector is a connector position assurance connector for an automotive application.

15. The method of claim 10 wherein the first Scalogram is a matrix of values representative of a magnitude of a detected sound at the specific frequency and the specific time.

16. The method of claim 10 wherein the processor is further configured to generate a first frequency domain signal in response to the first vibration.

17. The method of claim 10 wherein the first vibration is generated by a connector locking mechanism on the electrical connector engaging a restraint on a connector socket.

18. The method of claim 10 further including a microphone for detecting a sound generated by the engagement of the locking mechanism of the electrical connector.

19. An electrical connector verification system comprising:

a microphone for detecting a first sound generated by an engagement of a locking mechanism of an electrical connector and for generating a first time domain signal representative of the first sound;

a processor for generating a first matrix having a first plurality of magnitudes, each corresponding to the one of a plurality of specific times and a plurality of specific frequencies, in response to a continuous wavelet transform performed on the first time domain signal;

comparing, by the processor, the first plurality of magnitudes of the first matrix to a second plurality of magnitudes of a second matrix stored on a memory at each of the plurality of specific frequencies and the plurality of specific times common to each of the first matrix and the second matrix wherein the first matrix is a represented as a first Scalogram and the second matrix is represented as a second Scalogram and wherein the processor is further configured to perform a point-by-point comparison of magnitudes between the first Scalogram and the second Scalogram across a two-dimensional time/frequency coordinate grid to determine if the electrical connector is correctly seated into a corresponding socket and wherein the first Scalogram is generated via the continuous wavelet transform function of both the one of the specific time and the specific frequency;

generating a control signal in response to the first plurality of magnitudes of the first matrix and the second plurality of magnitudes of the second matrix having a correlation above a certainty threshold; and a user interface for displaying an indication of a correctly seated electrical connector in response to the control signal.

20. The electrical connector verification system of claim 19 further including an accelerometer for detecting a first vibration generated by the engagement of the locking mechanism of the electrical connector and for generating a third signal representative of the first vibration and wherein the processor is further operative for generating the control signal in response to the third signal matching a fourth signal representative of a second vibration generated in response to the correct engagement of the locking mechanism of the electrical connector above the certainty threshold.

* * * * *